(12) United States Patent
Wessels et al.

(10) Patent No.: US 9,136,398 B2
(45) Date of Patent: Sep. 15, 2015

(54) BIPOLAR MAGNETIC JUNCTION TRANSISTOR WITH MAGNETOAMPLIFICATION AND APPLICATIONS OF SAME

(75) Inventors: Bruce W. Wessels, Wilmette, IL (US); Nikhil Rangaraju, Elk Grove, IL (US); John A. Peters, Skokie, IL (US)

(73) Assignee: NORTHWESTERN UNIVERSITY, Evanston, IL (US)

(*) Notice: Subject to any disclaimer, the term of this patent is extended or adjusted under 35 U.S.C. 154(b) by 878 days.

(21) Appl. No.: 13/401,581

(22) Filed: Feb. 21, 2012

(65) Prior Publication Data

US 2013/0320971 A1 Dec. 5, 2013

Related U.S. Application Data

(60) Provisional application No. 61/444,974, filed on Feb. 21, 2011.

(51) Int. Cl.
| | |
|---|---|
| *H01L 43/08* | (2006.01) |
| *H01L 29/82* | (2006.01) |
| *G01R 33/06* | (2006.01) |
| *G01R 33/09* | (2006.01) |

(52) U.S. Cl.
CPC ............... *H01L 29/82* (2013.01); *G01R 33/06* (2013.01); *G01R 33/093* (2013.01)

(58) Field of Classification Search
USPC .......... 324/252; 257/421, 423, 425; 438/3, 14
See application file for complete search history.

(56) References Cited

U.S. PATENT DOCUMENTS

| | | | | |
|---|---|---|---|---|
| 6,482,729 | B2 * | 11/2002 | Ohno et al. ................... | 438/602 |
| 7,196,367 | B2 * | 3/2007 | Nikonov et al. .............. | 257/295 |
| 7,956,608 | B1 * | 6/2011 | Wessels et al. ............... | 324/252 |
| 2004/0113188 | A1 * | 6/2004 | Schmidt et al. ............... | 257/295 |
| 2012/0294078 | A1 * | 11/2012 | Kent et al. ..................... | 365/171 |

OTHER PUBLICATIONS

Meindl, J.D. et al., Limits on Silicon Nanoelectronics for Terascale Integration, Science, 2001, vol. 293, 2044-2049.
Frank, D.J. et al., Device Scaling Limits of Si MOSFETs and Their Application Dependencies, Proc. IEEE, 2001, vol. 89, 259-288.
Bernstein, K. et al., Device and Architecture Outlook for Beyond CMOS Switches, Proc. IEEE, 2010, vol. 98, 2169-2184.

(Continued)

*Primary Examiner* — Arleen M Vazquez
*Assistant Examiner* — Feba Pothen
(74) *Attorney, Agent, or Firm* — Locke Lord LLP; Tim Tingkang Xia, Esq.

(57) ABSTRACT

In one aspect of the present invention, the semiconductor device is a bipolar magnetic junction transistor (MJT), and includes a first non-magnetic semiconductor layer, a second non-magnetic semiconductor layer, and a magnetic semiconductor layer. The first non-magnetic semiconductor layer has majority charge carriers of a first polarity. The second non-magnetic semiconductor layer is disposed adjacent to the first non-magnetic semiconductor layer such that a first junction is formed at a first interface region between the first non-magnetic semiconductor layer and the second non-magnetic semiconductor layer. The magnetic semiconductor layer has majority charge carriers of the first polarity, and is disposed adjacent to the second non-magnetic semiconductor layer such that a second junction is formed at a second interface region between the second non-magnetic semiconductor layer and the magnetic semiconductor layer.

38 Claims, 9 Drawing Sheets

(56) References Cited

OTHER PUBLICATIONS

Chen, R.H. et al., Singleelectron Transistor Logic, Appl. Phys. Lett., 1996, vol. 68, 1954-1956.
Bachtold, Adrian et al., Logic Circuits with Carbon Nanotube Transistors, Science, 2001, vol. 294, 1317-1320.
Geim, A.K. et al., The Rise of Graphene, Nature Materials, 2007, vol. 6, 183-191.
Liao, L. et al., High Speed Graphene Transistors with a Self-Aligned Nanowire Gate, Nature, 2010, vol. 467, 305-308.
Huang, Yu et al., Logic Gates and Computation from Assembled Nanowire Building Blocks, Science, 2001, vol. 294, 1313-1317.
Collier, C.P. et al., Electronically Configurable Molecular-Based Logic Gates, Science, 1999, vol. 285, 391-394.
Datta, S. et al., Electronic Analog of the Electrooptic Modulator, Appl. Phys. Lett., 1990, vol. 56, 665-667.
Amlani, I. et al., Digital Logic Gate Using Quantum-Dot Cellular Automata, Science, 1999, vol. 284, 289-291.
Ney, A. et al., Programmable Computing with a Single Magnetoresistive Element, Nature, 2003, vol. 425, 485-487.
Allwood, D.A. et al., Magnetic Domain-Wall Logic, Science, 2005, vol. 309, 1688-1692.
Khitum, A. et al., Nano Scale Computational Architectures with Spin Wave Bus, Superlattices and Microstructures, 2005, vol. 38, 184-200.
Imre, A. et al., Majority Logic Gate for Magnetic Quantum-Dot Cellular Automata, Science, 2006, vol. 311, 205-208.
Sugahara, S. et al., Spin-Transistor Electronics: An Overview and Outlook, Proc. IEEE, 2010, vol. 98, 2124-2154.
Wolf, S.A. et al., The Promise of Nanomagnetics and Spintronics for Future Logic and Universal Memory, Proc. IEEE, 2010, vol. 98, 2155-2168.
Peters, J.A. et al., Spin-Dependent Magnetotransport in a p-InMnSb/n-InSb Magnetic Semiconductor Heterojunction Heterojunction, Appl. Phys. Lett., 2011, vol. 98, 193506.
Zutic, I. et al., Spin-Polarized Transport in Inhomogeneous Magnetic Semiconductors: Theory of Magnetic/Nonmagnetic p-n Junctions, Phys. Rev. Lett., 2002, vol. 88, 066603.
Sklansky, J., Conditional-Sum Addition Logic, IRE Transactions on Electronic Computers, 1960, vol. 9, 226-231.
Katz, R.H., Contemporary Logic Design, (Benjamins/Cummings, Redwood City, CA 1994) 669-670.
Rangaraju, N. et al., Magnetoamplification in a Bipolar Magnetic Junction Transistor, Phys. Rev. Lett., 2010, vol. 105, 117202-1.
McCray, W.P., How Spintronics Went From the Lab to The iPod, Nat. Nanotechnol., 2009, vol. 4, 2.
Dery, H. et al., Spin-Based Logic in Semiconductors for Reconfigurable Large-Scale Circuits, Nature, 2007, vol. 447, 573.
I. Zutic et al., Spintronics: Fundamentals and applications, Rev. of Mod. Phys., 76, 2, 323-410 (2004).
D. D. Awschalom et al., Challenges for semiconductor spintronics, Nat. Phys., 3, 153-159 (2007).
C. Chappert et al., The emergence of spin electronics in data storage, Nature Materials, 6, 813-823 (2007).
I. Appelbaum et al., Electronic measurement and control of spin transport in silicon, Nature, 447, 295-298 (2007).
B. Q. Huang et al., 35% magnetocurrent with spin transport through Si, Appl. Phys. Lett., 91, 052501 (2007).
T. Dietl et al., Ferromagnetic Semiconductor Heterostructures for Spintronics, IEEE Trans. on Electron Devices, 54, 5, 945-954 (2007).
N. Lebedeva et al., Modeling of ferromagnetic semiconductor devices for spintronics, J. of Appl. Phys., 93, 12, 9845-9864 (2003).
J. Fabian et al., Spin transport in inhomogeneous magnetic fields: A proposal for Stern-Gerlach-like experiments with conduction electrons, Phys. Rev. B, 66, 024436 (2002).
R. R. Pela et al., Simulation of a spintronic transistor: A study of its performance, J. Magn. Magn. Mater., 321, 984-989 (2009).
I. Zutic et al., Bipolar spintronics: Fundamentals and applications, IBM, J. of Res. And Dev., 50, 1, 121 (2006).
S. J. May et al., High-field magnetoresistance in $\rho$-(In, Mn)As/n-InAs heterojunctions, Appl. Phys. Lett., 88, 072105 (2006).
N. Rangaraju et al., Giant magnetoresistance of magnetic semiconductor heterojunctions, Phys. Rev. B, 79, 205209 (2009).
B. W. Wessels, Ferromagnetic semiconductors and the role of disorder, New J. of Phys., 10, 055008 (2008).
P. T. Chiu et al., Dependence of magnetic circular dichroism on doping and temperature in $In_{1-x}Mn_xAs$, Phys. Rev. B, 76, 165201 (2007).
J. Fabian et al., Magnetic bipolar transistor, Appl. Phys. Lett., 84, 1, 85-87 (2004).
J. Fabian et al., The Ebers-Moll model for magnetic bipolar transistors, Appl. Phys. Lett., 86, 133506 (2005).
S. M. Sze et al., Physics of Semiconductor Devices (Wiley-Interscience, 2007).
G. W. Neudeck, The Bipolar Junction Transistor, Modular series on solid state devices (Addison-Wesley Publishing Company, Inc., 1989), vol. III.

\* cited by examiner

BIPOLAR MAGNETIC JUNCTION TRANSISTOR WITH MAGNETOAMPLIFICATION AND APPLICATIONS OF SAME

CROSS-REFERENCE TO RELATED PATENT APPLICATION

This application claims priority to and the benefit of, pursuant to 35 U.S.C. §119(e), U.S. provisional patent application Ser. No. 61/444,974, filed Feb. 21, 2011, entitled "A BIPOLAR MAGNETIC JUNCTION TRANSISTOR WITH MAGNETOAMPLIFICATION AND APPLICATIONS OF SAME," by Bruce W. Wessels, Nikhil Rangaraju and John A. Peters, the disclosure of which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [13] represents the 13th reference cited in the reference list, namely, B. W. Wessels, New J. Phys. 10 (2008).

STATEMENT AS TO RIGHTS UNDER FEDERALLY-SPONSORED RESEARCH

This invention was made with Government support under FA9550-07-1-0381 awarded by Air Force Office of Scientific Research. The government has certain rights in the invention.

FIELD OF THE INVENTION

The present invention relates generally to a bipolar magnetic junction transistor, and more particularly to an InMnAs bipolar magnetic junction transistor with magnetoamplification and applications of the same.

BACKGROUND OF THE INVENTION

Spintronic devices are being developed as an alternative to conventional semiconductor devices for many applications including information storage, communications and information processing [1-3]. Hybrid unipolar devices comprising ferromagnetic metals and semiconductors have been employed to demonstrate spin injection and detection in Si [4, 5]. However, for integration and fabrication of all-semiconductor magneto-electronic devices, dilute magnetic semiconductors (DMS), which are semiconductors doped with transition metals instead of or in addition to electronically active elements, are the likely candidates, and many possible unipolar and bipolar devices have been already proposed using these materials [6].

Therefore, a heretofore unaddressed need exists in the art to address the aforementioned deficiencies and inadequacies.

SUMMARY OF THE INVENTION

The present invention, in one aspect, relates to a semiconductor device. In one embodiment, the semiconductor device includes a first non-magnetic semiconductor layer, a second non-magnetic semiconductor layer, and a magnetic semiconductor layer. The first non-magnetic semiconductor layer has majority charge carriers of a first polarity. The second non-magnetic semiconductor layer is disposed adjacent to the first non-magnetic semiconductor layer such that a first junction is formed at a first interface region between the first non-magnetic semiconductor layer and the second non-magnetic semiconductor layer. The magnetic semiconductor layer has majority charge carriers of the first polarity, and is disposed adjacent to the second non-magnetic semiconductor layer such that a second junction is formed at a second interface region between the second non-magnetic semiconductor layer and the magnetic semiconductor layer.

In one embodiment, the semiconductor device further includes a first electrode that is in an ohmic contact with the first non-magnetic semiconductor layer; a second electrode that is in an ohmic contact with the second non-magnetic semiconductor layer; and a third electrode that is in an ohmic contact with the magnetic semiconductor layer.

In one embodiment, the semiconductor device is a bipolar magnetic junction transistor (MJT).

In one embodiment, the first non-magnetic semiconductor layer comprises InAs, which is p-type doped.

In one embodiment, the magnetic semiconductor layer comprises p-type doped InMnAs.

In one embodiment, the second non-magnetic semiconductor layer is charge carrier neutral. In one embodiment, the second non-magnetic semiconductor layer comprises undoped InAs. In one embodiment, the second non-magnetic semiconductor layer has majority charge carriers of a second polarity that is opposite of the first polarity. In one embodiment, the second non-magnetic semiconductor layer comprises n-type doped InAs.

In one embodiment, the magnetic semiconductor layer has a Curie temperature that is greater than about 298 K.

In one embodiment, when a first voltage is applied between the first electrode and the second electrode and a second voltage is applied between the second electrode and the third electrode, a first electrical current flows into or out of the magnetic semiconductor layer, and a second electrical current flows into or out of the second non-magnetic semiconductor layer, the ratio of the first electrical current and the second electrical current being a current amplification.

In one embodiment, when a magnetic field is applied to the magnetic semiconductor layer in a direction substantially perpendicular to a plane of the second junction, the current amplification is a function of the magnitude of the magnetic field.

In another aspect, the present invention relates to an apparatus for detecting magnetic field. In one embodiment, the apparatus includes a semiconductor device, means for subjecting the magnetic semiconductor layer to a test area, and a magnetic field detector.

In one embodiment, the semiconductor device includes a first non-magnetic semiconductor layer with majority charge carriers of a first polarity; a second non-magnetic semiconductor layer disposed adjacent to the first non-magnetic semiconductor layer such that a first junction is formed at a first interface region between the first non-magnetic semiconductor layer and the second non-magnetic semiconductor layer; and a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer. When a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification, the current amplification is a function of magnitude of an external magnetic field when the external magnetic field is applied to the magnetic semiconductor layer in a direction substantially perpendicular to a plane of the second junction.

The magnetic field detector is coupled to the semiconductor device for determining the presence of the external magnetic field in the test area by measuring current amplification and determining if the current amplification changes due to the external magnetic field.

In one embodiment, the subjecting means is a read head.

In yet another aspect, the present invention relates to a method of detecting magnetic field. The method in one embodiment includes providing a semiconductor device, subjecting the magnetic semiconductor layer to a test area; and determining the presence of the external magnetic field in the test area by measuring current amplification and determining if the current amplification changes due to the external magnetic field.

In one embodiment, the semiconductor device includes a first non-magnetic semiconductor layer with majority charge carriers of a first polarity; a second non-magnetic semiconductor layer disposed adjacent to the first non-magnetic semiconductor layer such that a first junction is formed at a first interface region between the first non-magnetic semiconductor layer and the second non-magnetic semiconductor layer; and a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer. When a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification, the current amplification is a function of magnitude of an external magnetic field when the external magnetic field is applied to the magnetic semiconductor layer in a direction substantially perpendicular to a plane of the second junction.

In a further aspect, the present invention relates to a reprogrammable logic apparatus. In one embodiment, the apparatus includes at least one semiconductor device, subjecting means, and a storage member.

In one embodiment, the at least one semiconductor includes a first non-magnetic semiconductor layer with majority charge carriers of a first polarity; a second non-magnetic semiconductor layer disposed adjacent to the first non-magnetic semiconductor layer such that a first junction is formed at a first interface region between the first non-magnetic semiconductor layer and the second non-magnetic semiconductor layer; and a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer. When a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification. The presence of an external magnetic field causes the current amplification to change. The magnetic semiconductor material is in a first non-volatile state when there is a change in the current amplification, and the magnetic semiconductor material is in a second non-volatile state when there is not a change in the current amplification. Each of the first and second non-volatile states represents a binary value.

The subjecting means is provided for subjecting the magnetic semiconductor layer to a magnetic field to set the magnetic semiconductor material to one of the first and second non-volatile states, thereby generating a corresponding new binary value relating to a new input logic signal. In one embodiment, the subjecting means is a read head.

The storage is provided for storing the new binary value relating to the new input logic signal so as to reprogram a logic process.

In yet a further aspect, the present invention relates to a method of operating a reprogrammable logic process. In one embodiment, the method includes providing at least one semiconductor device, providing a new input logic signal for the reprogrammable logic process, subjecting the magnetic semiconductor layer to a magnetic field to set the magnetic semiconductor material to one of the first and second non-volatile states, thereby generating a corresponding new binary value relating to the new input logic signal, and storing the new binary value relating to the new input logic signal so as to reprogram the logic process.

In one embodiment, the at least one semiconductor device includes: a first non-magnetic semiconductor layer with majority charge carriers of a first polarity; a second non-magnetic semiconductor layer disposed adjacent to the first non-magnetic semiconductor layer such that a first junction is formed at a first interface region between the first non-magnetic semiconductor layer and the second non-magnetic semiconductor layer; and a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer. When a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification, the presence of an external magnetic field causes the current amplification to change, the magnetic semiconductor material is in a first non-volatile state when there is a change in the current amplification, and the magnetic semiconductor material is in a second non-volatile state when there is not a change in the current amplification, and each of the first and second non-volatile states represents a binary value.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1A:
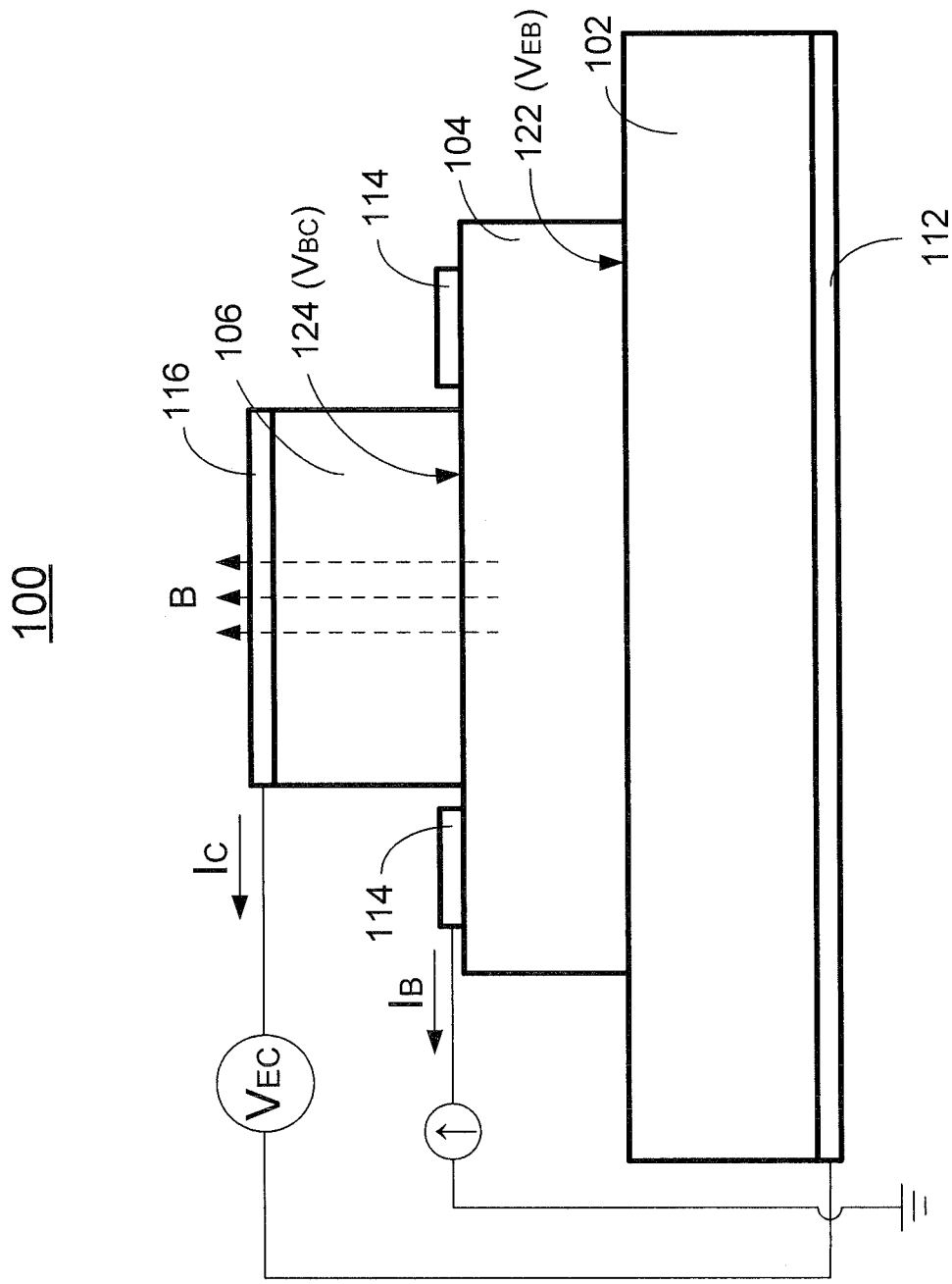
FIG. 1A shows schematically a plain view of a semiconductor device according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

As used herein, the term "ohmic contact" refers to a non-rectifying junction, which is a region on a semiconductor device that has been prepared so that the current-voltage (I-V) curve of the region is linear and symmetric. If the I-V characteristic is non-linear and asymmetric, the contact is not ohmic, but is a blocking or Schottky barrier contact, which creates a rectifying junction, known as a Schottky diode.

OVERVIEW OF THE INVENTION

A semiconductor transistor where one or more of the active layers is replaced with a ferromagnetic semiconductor has been proposed to exhibit additional functionalities [7-9]. In particular, the bipolar magnetic junction transistor (MJT), which refers to a three-terminal electronic device constructed of doped semiconductor material, has been predicted to have unique properties like magneto-amplification (MA), which is the change of amplification upon application of an external magnetic field [10].

In one aspect of the present invention, a semiconductor device, i.e., a bipolar MJT using a dilute magnetic semiconductor is provided. In one embodiment, the semiconductor device includes a first non-magnetic semiconductor layer, a second non-magnetic semiconductor layer, and a magnetic semiconductor layer. The first non-magnetic semiconductor layer has majority charge carriers of a first polarity. The second non-magnetic semiconductor layer is disposed adjacent to the first non-magnetic semiconductor layer such that a first junction is formed at a first interface region between the first non-magnetic semiconductor layer and the second non-magnetic semiconductor layer. The magnetic semiconductor layer has majority charge carriers of the first polarity, and is disposed adjacent to the second non-magnetic semiconductor layer such that a second junction is formed at a second interface region between the second non-magnetic semiconductor layer and the magnetic semiconductor layer.

For an InMnAs p-n-p transistor, magneto-amplification is observed at the room temperature. The observed magneto-amplification is attributed to the magnetoresistance of the magnetic semiconductor InMnAs heterojunction of the MJT. The magnetic field dependence of the transistor characteristics confirms that the magneto-amplification results from the junction magnetoresistance.

The basic building blocks of a bipolar magnetic junction transistor are magnetic diodes. Recently, the inventors have found that p-n junctions using the p-type magnetic semiconductor InMnAs show a giant positive magnetoresistance [11]. The magnetotransport properties of InMnAs/InAs p-n junctions were previously simulated using a modified Shockley equation that includes magnetoresistive effects. The giant positive magnetoresistance is attributed to spin-selective conduction through spin split bands [12]. InMnAs, when grown by metal organic vapor phase epitaxy (MOVPE), is a ferromagnetic semiconductor with a Curie temperature of 330 K [13]. Magnetic circular dichroism experiments on InMnAs indicate strong s, p-d exchange at the room temperature, leading to formation of spin-split bands that results in a positive magnetoresistance [14]. The giant magnetoresistive properties of the InMnAs junction make this material an ideal candidate for use in an MJT. Here the inventors report on the room-temperature operation of an InMnAs based bipolar magnetic junction transistor. Magneto-amplification is observed for the first time in a bipolar magnetic junction transistor. To describe the experimentally observed transistor characteristics, the inventors propose a modified Ebers-Moll model that includes a series magnetoresistance attributed to spin-selective conduction. The capability of magnetic field control of the amplification in an all-semiconductor transistor at room temperature potentially enables the creation of new computer logic architecture where the spin of the carriers is utilized.

In another aspect, the present invention relates to an apparatus for detecting magnetic field by utilizing the semiconductor device as disclosed above. In one embodiment, the apparatus includes a semiconductor device, means for subjecting the magnetic semiconductor layer to a test area, and a magnetic field detector.

The semiconductor device includes: a first non-magnetic semiconductor layer with majority charge carriers of a first polarity; a second non-magnetic semiconductor layer disposed adjacent to the first non-magnetic semiconductor layer such that a first junction is formed at a first interface region between the first non-magnetic semiconductor layer and the second non-magnetic semiconductor layer; and a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer. When a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification, the current amplification is a function of magnitude of an external magnetic field when the external magnetic field is applied to the magnetic semiconductor layer in a direction substantially perpendicular to a plane of the second junction.

The magnetic field detector is coupled to the semiconductor device for determining the presence of the external magnetic field in the test area by measuring current amplification and determining if the current amplification changes due to the external magnetic field.

In yet another aspect, the present invention relates to a method of detecting magnetic field. The method includes providing a semiconductor device, subjecting the magnetic semiconductor layer to a test area, and determining the presence of the external magnetic field in the test area by measuring current amplification and determining if the current amplification changes due to the external magnetic field.

In one aspect of the present invention, a reprogrammable logic apparatus that utilizes at least one semiconductor device as disclosed above. The reprogrammable logic apparatus also includes means for subjecting the magnetic semiconductor layer to a magnetic field to set the magnetic semiconductor material to one of the first and second non-volatile states, thereby generating a corresponding new binary value relating to a new input logic signal, and a storage member for storing the new binary value relating to the new input logic signal so as to reprogram a logic process.

In a further aspect, the present invention also relates to a method of operating a reprogrammable logic process. In one embodiment, the method includes providing at least one semiconductor device, providing a new input logic signal for the reprogrammable logic process, subjecting the magnetic semiconductor layer to a magnetic field to set the magnetic semiconductor material to one of the first and second non-volatile states, thereby generating a corresponding new binary value relating to the new input logic signal, and storing the new binary value relating to the new input logic signal so as to reprogram the logic process. The at least one semiconductor device in one embodiment, is the same as disclosed above.

These and other aspects of the present invention are more specifically described below.

IMPLEMENTATIONS AND EXAMPLES OF THE INVENTION

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Example One

FIG. 1A shows schematically a plain view of a semiconductor device according to one embodiment of the present invention. In FIG. 1A, the semiconductor device is a bipolar magnetic junction transistor (MJT), which includes a first non-magnetic semiconductor layer 102, a second non-magnetic semiconductor layer 104, and a magnetic semiconductor layer 106. The second non-magnetic semiconductor layer 104 is disposed adjacent to the first non-magnetic semiconductor layer 102, and the magnetic semiconductor layer 106 is disposed adjacent to the second non-magnetic semiconductor layer 104. The first non-magnetic semiconductor layer 102 and the magnetic semiconductor layer 106 are relatively conductive to the second non-magnetic semiconductor layer 104 to form the bipolar MJT structure. In the bipolar MJT structure, the first non-magnetic semiconductor layer 102 serves as the emitter, the magnetic semiconductor layer 106 serves as the collector, and the second non-magnetic semiconductor layer 104 is used as the base layer.

In one embodiment, the semiconductor device has a p-n-p structure, where the first non-magnetic semiconductor layer 102 and the magnetic semiconductor layer 106 are p-type layers, which have majority charge carriers of a first polarity (i.e., p-type), and the second non-magnetic semiconductor layer 104 is a n-type layer, which has majority charge carriers of a second polarity (i.e., n-type) that is opposite to the first polarity. Accordingly, a first junction is formed at a first interface region 122 between the first non-magnetic semiconductor layer 102 (the p-type layer) and the second non-magnetic semiconductor layer 104 (the n-type layer), and a second junction is formed at a second interface region 124 between the second non-magnetic semiconductor layer 104 (the n-type layer) and the magnetic semiconductor layer 106 (the p-type layer), thus forming a p-n-p heterojunction structure.

Further, for each of the three layers, there is a respective electrode to be in ohmic contacts with the corresponding layer. Specifically, a first electrode 112 is in an ohmic contact with the first non-magnetic semiconductor layer 102 to serve as the emitter contact, a second electrode 114 is in an ohmic contact with the second non-magnetic semiconductor layer 104 to serve as the base contact, and a third electrode 116 is in an ohmic contact with the magnetic semiconductor layer 106 to serve as the collector contact.

In one embodiment, the material of the first non-magnetic semiconductor layer 102 is p-type doped InAs (p-InAs), the material of the second non-magnetic semiconductor layer 104 is n-type doped InAs (n-InAs), and the material of the magnetic semiconductor layer 106 is p-type doped InMnAs (p-InMnAs) so that the magnetotransport properties of InMnAs/InAs p-n junctions can be utilized. The material of the first, second and third electrodes 112, 114 and 116 can be Ti/Au.

In an alternative embodiment, to form the bipolar MJT structure, the second non-magnetic semiconductor layer 104 can also be charge carrier neutral. In one embodiment, the material of the second non-magnetic semiconductor layer 104 is undoped InAs.

As shown in FIG. 1A, a first voltage $V_{EB}$ is applied between the first electrode 112 and the second electrode 114, and a second voltage $V_{BC}$ is applied between the second electrode 114 and the third electrode 116. In other words, the first voltage $V_{EB}$ is applied across the first junction between the first non-magnetic semiconductor layer 102 (the emitter) and second non-magnetic semiconductor layer 104 (the base), and the second voltage $V_{BC}$ is applied across the second junction between the second non-magnetic semiconductor layer 104 (the base) and the magnetic semiconductor layer 106 (the collector). Since the first, second and third electrodes 112, 114 and 116 are in ohmic contacts with the respective layers 102, 104 and 106, a voltage $V_{EC}$ between the first electrode 112 and the third electrode 116 can be obtained by the addition of the first voltage $V_{EB}$ and the second voltage $V_{BC}$. The voltage $V_{EC}$ is an emitter-collector voltage, i.e. the voltage between the first non-magnetic semiconductor layer 102 (the emitter) and the magnetic semiconductor layer 106 (the collector).

Further, in FIG. 1A, a first electrical current $I_C$ flows out of the magnetic semiconductor layer 106 (the collector), and a second electrical current $I_B$ flows out of the second non-magnetic semiconductor layer 104 (the base). The first electrical current $I_C$ is a collector current, and the second electrical current $I_B$ is a base current. It should be noted that the first electrical current $I_C$ and the second electrical current $I_{CB}$, may flow to the other direction, i.e., the first electrical current $I_C$ may flow into the magnetic semiconductor layer 106, and the second electrical current $I_B$ may flow into the second non-magnetic semiconductor layer 104. Thus, the ratio of the first electrical current $I_C$ and the second electrical current $I_B$ is a current amplification.

In one embodiment, when a magnetic field B is applied to the magnetic semiconductor layer 106 in a direction substantially perpendicular to a plane of the second junction, as shown in the dotted lines in FIG. 1A, the current amplification, which is the ratio of the first electrical current $I_C$ and the second electrical current $I_B$, is a function of the magnitude of the magnetic field B. The functional relationship of the current amplification and the magnetic field B will be described in detail later.

Example Two

Figure 1B:
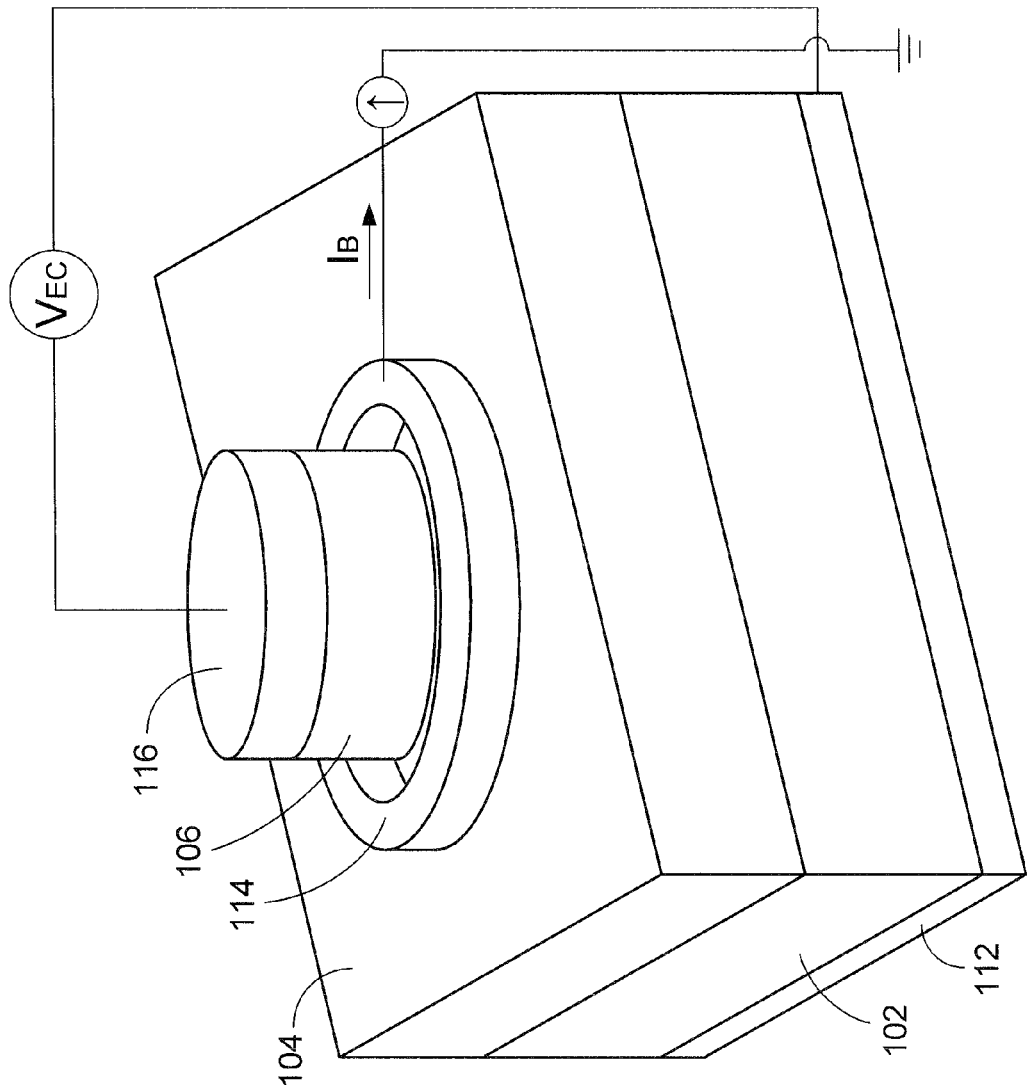
FIG. 1B shows schematically a prospective view of an InMnAs bipolar magnetic junction transistor according to one embodiment of the present invention

FIG. 1B shows schematically a semiconductor device according to one embodiment of the present invention. In FIG. 1B, the semiconductor device 100 is a InMnAs bipolar MJT with similar structure to the semiconductor device in FIG. 1A. Applicant has used the InMnAs bipolar MJT as an experimental prototype to measure the transistor properties of the bipolar MJT.

In FIG. 1B, the first non-magnetic semiconductor layer 102, which is the emitter of the bipolar MJT, is formed by a P-type InAs ($p_E$=5×10$^{18}$ cm$^{-3}$) substrate. The second nonmagnetic semiconductor layer 104, which is the base, is formed by a 150 nm thick layer of undoped epitaxial layer of InAs. The magnetic semiconductor layer 106, which is the collector, is an InMnAs ($p_C$=1×10$^{18}$ cm$^{-3}$) epitaxial layer.

In one embodiment, manufacturing the InMnAs/InAs/p-InAs heterojunctions of the semiconductor device 100 can be achieved by depositing the base 104 and the collector 106 on the emitter substrate 102 by metalorganic vapor phase epitaxy. More specifically, the InMnAs/InAs/p-InAs heterojunctions can be fabricated by depositing a layer of 150 nm InAs ($n_B$=1×10$^{16}$ cm$^{-3}$) on the p-type InAs substrate 102 by metalorganic vapour phase epitaxy to form the base 104, then followed by depositing a circular layer of 75 nm of InMnAs by metalorganic vapour phase epitaxy to form the collector 106. The first, second and third electrodes 112, 114 and 116 can be defined by photolithography using the Ti/Au material. Specifically, a circular third electrode 116 with a 250 µm diameter can be defined by photolithography as the Ti/Au collector contact, and the first and second electrodes 112 and 114 can be defined in subsequent photolithography and contact deposition steps to serve as the base and emitter contacts.

Applicant has used the InMnAs bipolar MJT 100 as an experimental prototype to measure the transistor characteristics and properties of the bipolar MJT. All reported measurements are in the common emitter mode where the p-type InAs substrate 102 serves as the emitter.

In the experiment, the transistor properties of the bipolar MJT were measured using a Keithley 4200 semiconductor parameter analyzer. The I-V characteristics were measured at a Curie temperature of 298K. The emitter-collector voltage $V_{EC}$ was varied between 0 to 0.4V, and the base current (the second electrical current) $I_B$ ranged from 0 to 5 µA, in steps of 1 µA. The transistor characteristics were measured in a magnetic field B that is perpendicular to the plane of the second junction, using fields from 0 to 8 T.

To explain the behavior of the bipolar MJT in the presence of a magnetic field B, its characteristics have been previously modeled for the case of a magnetic emitter and base [7, 10, 15]. An Ebers-Moll transistor model was used and these calculations showed that in the presence of an equilibrium spin polarization, injection and transport of spin polarized carriers leads to a change of amplification for the transistor with magnetic field strength [16]. In this model, the equilibrium spin (due to spin splitting of the conduction or valence band of the semiconductor) is accounted for in the pre-factor to the forward and reverse biased coupled diode current expressions. The model predicts a positive magneto-amplification effect where increasing the magnetic field leads to an increase in amplification.

In contrast, in the experiment, a negative magneto-amplification was observed where increasing the magnetic field leads to a decrease in amplification. To describe the experimentally observed transistor characteristics, the inventors propose a modified Ebers-Moll equivalent circuit that includes a series magnetoresistance. In the absence of non-equilibrium spin, the reverse current term used in the Ebers-Moll model for the bipolar magnetic junction transistor is replaced with a modified Shockley diode equation.

Figure 2:
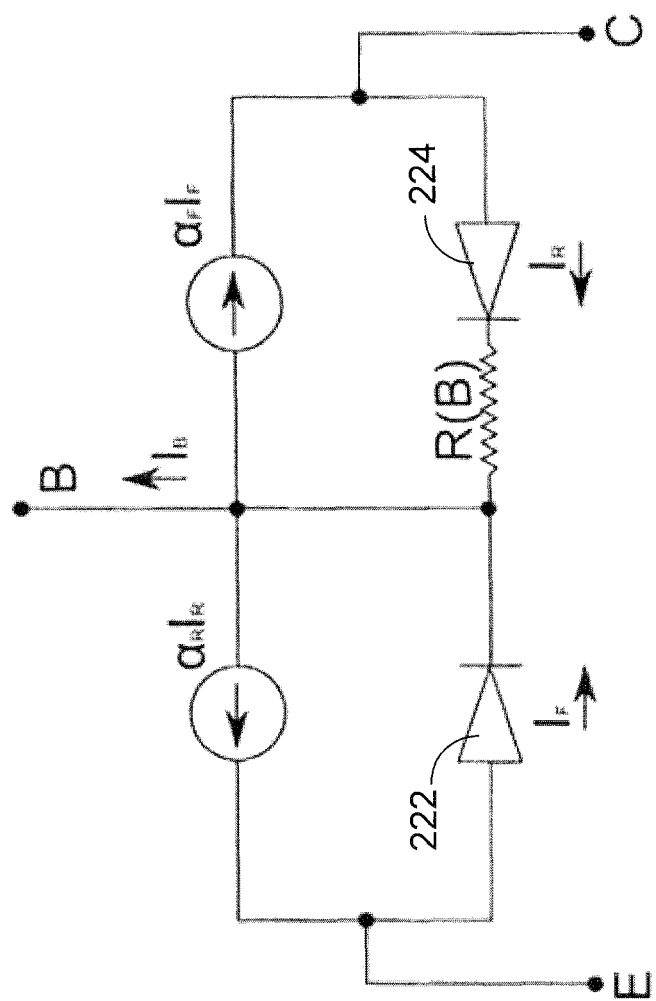
FIG. 2 shows schematically a circuitry diagram of a modified Ebers-Moll equivalent circuit of a bipolar MJT according to one embodiment of the present invention.

FIG. 2 shows schematically a circuitry diagram of a modified Ebers-Moll equivalent circuit of a bipolar MJT according to one embodiment of the present invention. According to FIG. 2, the circuit has the emitter E, the base B and the collector C shown as nodes, and includes two coupled diodes 222 and 224 and a magnetic field dependent resistance R(B) in series with the collector-base (reverse) diode 224. This resistance accounts for the magnetoresistance of the collector-base magnetic junction, i.e. the second junction 124 shown in FIG. 1A. The modified reverse diode current ($I_R$) is given by:

$$I_R = I_{R0} \exp\left(\frac{V_{CB} - I_R R(B)}{\eta_{CB} V_t}\right) \quad (1)$$

where $I_{R0}$ is a current pre-factor, R(B) is the magnetic-field dependent resistance, $\eta_{CB}$ is the junction ideality factor, Vt is the thermal voltage, and $V_{CB}$ is the applied bias between the collector C and the base B.

More specifically, Ebers-Moll equations for a transistor are given by the following:

$$I_E = I_F - \alpha_R I_R \quad (1.1)$$

$$I_C = \alpha_F I_F - I_R \quad (1.2)$$

$$I_B = (1-\alpha_F)I_F + (1-\alpha_R)I_R \quad (1.3)$$

The emitter current ($I_F$), base current ($I_B$) and collector current ($I_C$) are defined in terms of the forward and reverse currents. The α's depend on junction properties and temperature.

$$\alpha_F = \frac{D_B}{WN_B}\left[\frac{D_E}{W_E N_E} + \frac{D_B}{WN_B}\right]^{-1} \quad (1.4)$$

$$\alpha_R = \frac{D_B}{WN_B}\left[\frac{D_C}{W_C N_C} + \frac{D_B}{WN_B}\right]^{-1} \quad (1.5)$$

The forward ($I_F$) and reverse ($I_R$) currents are defined as follows:

$$I_F = I_{F0}\left(\exp\left(\frac{V_{EB}}{\eta_1 V_t}\right) - 1\right) \quad (1.6)$$

$$I_{F0} = qA_F^2 n_i^2\left[\frac{D_E}{W_E N_E} + \frac{D_B}{WN_B}\right] \quad (1.7)$$

$$I_R = I_{R0}\left(\exp\left(\frac{V_{CB} - I_R R(B)}{\eta_2 V_t}\right) - 1\right) \quad (1.8)$$

$$I_{R0} = qA_R^2 n_i^2\left[\frac{D_C}{W_C N_C} + \frac{D_B}{WN_B}\right] \quad (1.9)$$

where $D_i$'s are diffusion coefficients, $N_i$'s are the carrier concentrations for the different regions, $L_i$'s are the diffusion lengths, A's are areas of the junctions of the device, q is the charge of an electron, $n_i$ is the intrinsic carrier concentration, W is the width of the base and $V_t$ is the thermal voltage.

Further, in equation 1.8, the resistance R(B) is the magnetoresistance of the InMnAs/InAs junction. The amplification and the magneto-amplification are given by:

$$\text{Amplification} = \beta_{dc} = \frac{I_C(I_B) - I_C(0)}{I_B} \quad (1.10)$$

Magneto-amplification (%)(B, VEC) = (1.11)

$$MA = \frac{\beta_{dc}(B) - \beta_{dc}(0)}{\beta_{dc}(0)} \times 100$$

For a given base current and emitter-collector bias ($V_{EC}$) and for an ideal diode (η's are 1), we rearrange the Ebers-Moll equations. From the equations 1.6, 1.8 and 1.3:

$$V_{EB} = V_t \left[ \ln\left(\frac{I_F}{I_{F0}} + 1\right) \right] \quad (1.12)$$

$$V_{CB} = I_R R(B) + V_t \left[ \ln\left(\frac{I_R}{I_{R0}} + 1\right) \right] \quad (1.13)$$

$$V_{CB} - \left(\frac{I_B - (1-\alpha_F)I_F}{(1-\alpha_R)}\right) R(B) + V_t \left[ \ln\left(\frac{I_B - (1-\alpha_F)I_F}{(1-\alpha_R)I_{R0}} + 1\right) \right] \quad (1.14)$$

Noting that $V_{EC} = V_{EB} - V_{CB}$. Upon substitution of $V_{EB}$ and $V_{CB}$ from the equations 1.12 and 1.13, $$V_{EC} = V_{EB} - V_{CB} = V_t \left[ \ln\left(\frac{I_F}{I_{F0}} + 1\right) \right] - \quad (1.15)$$
$$\left(\frac{I_B - (1-\alpha_F)I_F}{(1-\alpha_R)}\right) R(B) - V_t \left[ \ln\left(\frac{I_B - (1-\alpha_F)I_F}{(1-\alpha_R)I_{R0}} + 1\right) \right]$$

Figure 3:
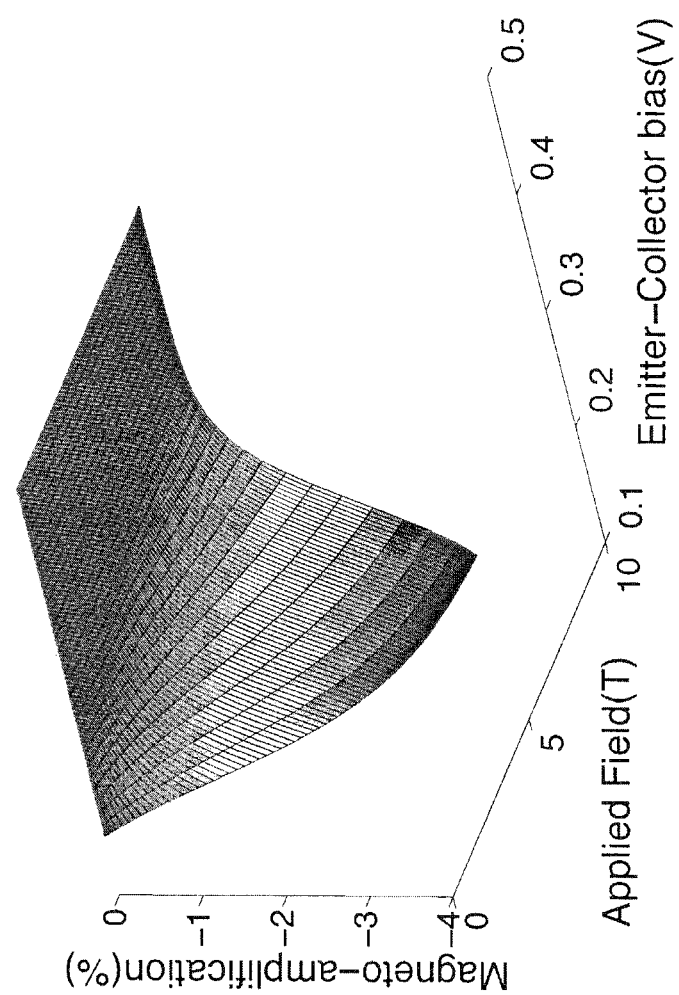
FIG. 3 shows schematically a diagram of the calculated variation of magneto-amplification as a function of magnetic field and emitter-collector bias.

The equation 1.15 is solved for a constant base current for different magnetic fields. The resistance R(B) is assumed to have a R0[1+C*tan h($g\mu_B B/k_B T$)] functional form, where C is a constant, $\mu_B$ is the Bohr magneton and g is the effective Lande factor. The magnetocurrent for the InMnAs/InAs heterojunctions suggests the functional form for the resistance as a function of a magnetic field. At a given voltage, the current through the junction decreases quickly and then saturates, this led us to using the tan h functional form for the magnetoresistance in the junction. The tan h function is assumed to reflect that the change in resistance is higher for low magnetic fields and saturates slowly with magnetic field. FIG. 3 shows schematically a diagram of the calculated variation of magneto-amplification as a function of the magnetic field B and the emitter-collector bias, i.e. the voltage $V_{EC}$. For a given emitter-collector bias $V_{EC}$, the magneto-amplification decreases with magnetic field. For higher emitter-collector voltages, the calculation shows that the magnitude of magneto-amplification decreases. This agrees with the trend for magneto-amplification seen in the experimental data.

As set forth above, the modified Ebers-Moll model is used to relate the magneto-amplification of the transistor to the magnetoresistance of the collector-base magnetic junction, such as the second junction 124 in FIG. 1A. The magneto-amplification results from the magnetoresistance of the collector-base (p-InMnAs/undoped-InAs) junction (the second junction 124 shown in FIG. 1A). The inventors attribute this magnetoresistance to spin-dependent transport through two spin channels [12]. When a magnetic field B is applied, spin-selective transport in the reverse biased p-n junction leads to an increase in R(B) as has been previously shown [12]. This in turn leads to a decrease in the collector current for both zero base and finite base currents [17]. Since the decrease in the collector current for a finite base current is larger than the decrease in the collector current at zero base current, a negative magneto-amplification will be observed [18]. For a given emitter-collector bias $V_{EC}$ and a given base current $I_B$, a change in the resistance in the InMnAs/InAs junction results in changes in both the forward and reverse diode currents as these diodes are coupled. As set forth above, the calculation shows that the magneto-amplification depends on the functional form of the magnetoresistance for the InMnAs collector junction and its magnetic field dependence, and that for a given base current the magneto-amplification decreases for increasing $V_{EC}$.

Figure 4:
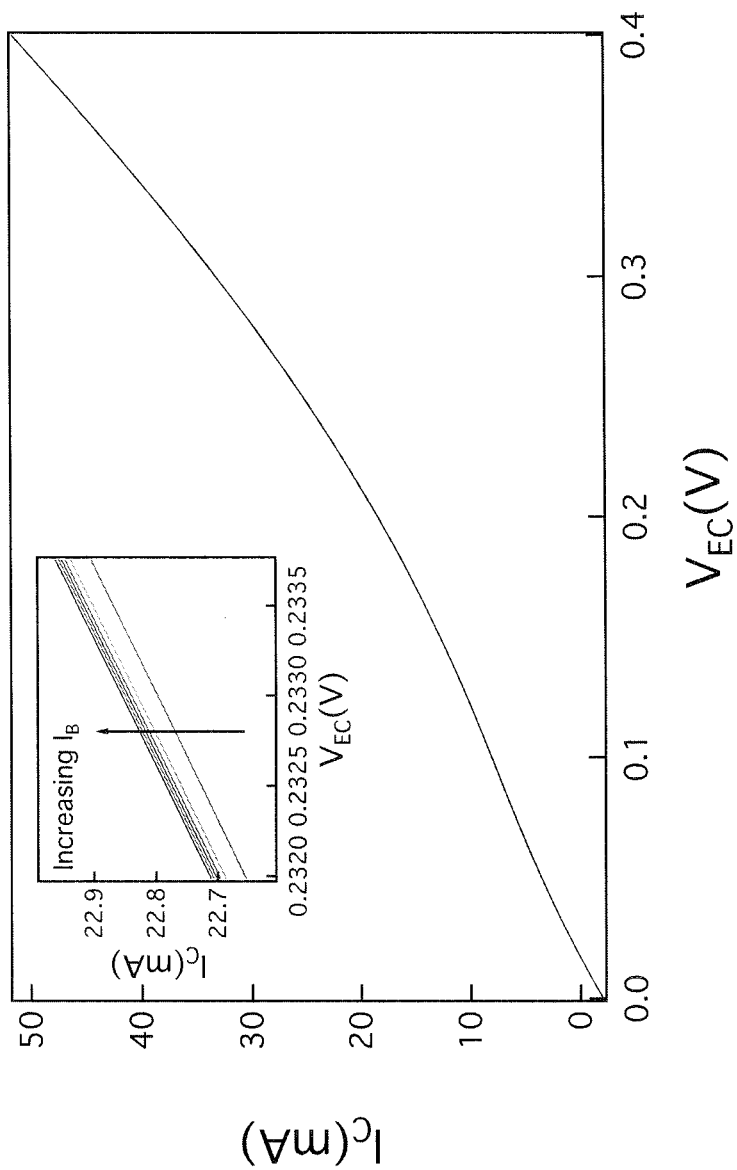
FIG. 4 shows a curve diagram of the transistor characteristics measured for the InMnAs bipolar magnetic junction transistor of FIG. 1B.

FIG. 4 shows a curve diagram of the transistor characteristics measured for the InMnAs bipolar magnetic junction transistor of FIG. 1B. In FIG. 4, the transistor characteristics are measured in the common emitter mode at the temperature of 298K and zero magnetic field. According to FIG. 4, the slope of the characteristic curve is high for very small voltages and decreases for voltages higher than 0.05V, which shows the tendency towards saturation for voltages less than 0.05V. For voltages higher than 0.05V, the slope of the collector current $I_C$ curve decreases as expected for the active region of the transistor [19]. With an increase in the base current $I_B$, an increase in the collector current $I_C$ is observed as shown in the inset of FIG. 4. It should be noted that the change in the collector current $I_C$ is shown as a function of the base current $I_B$. The base current $I_B$ increases in steps of 1 µA. As the voltage $V_{EC}$ is increased, there is a corresponding increase in the collector current $I_C$. This presumably results from base width modulation (early effect) and leads to a non-zero slope. A reverse bias applied to the n-InAs/p-InMnAs junction (the second junction 124 in FIG. 1A) results in a very high hole current that leads to the high collector currents observed in the transistor. The high hole concentration of $5 \times 10^{18}$ cm$^{-3}$ in the p-InAs emitter improves the transistor performance. At higher $V_{EC}$, an increase in slope occurs in the collector current curve.

Small changes in the base current $I_B$ result in significant changes in the collector current $I_c$ and correspond to a positive amplification. Thus, the amplification ($\beta_{dc}$) of the transistor was measured where $\beta_{dc}$ is defined as follows:

$$\beta_{dc} = \frac{I_C(I_B) - I_C(0)}{I_B} \quad (2)$$

where $I_C(I_B)$ is the collector current for a constant base current of $I_B$, and $I_C(0)$ is the collector current for zero base current.

Figure 5:
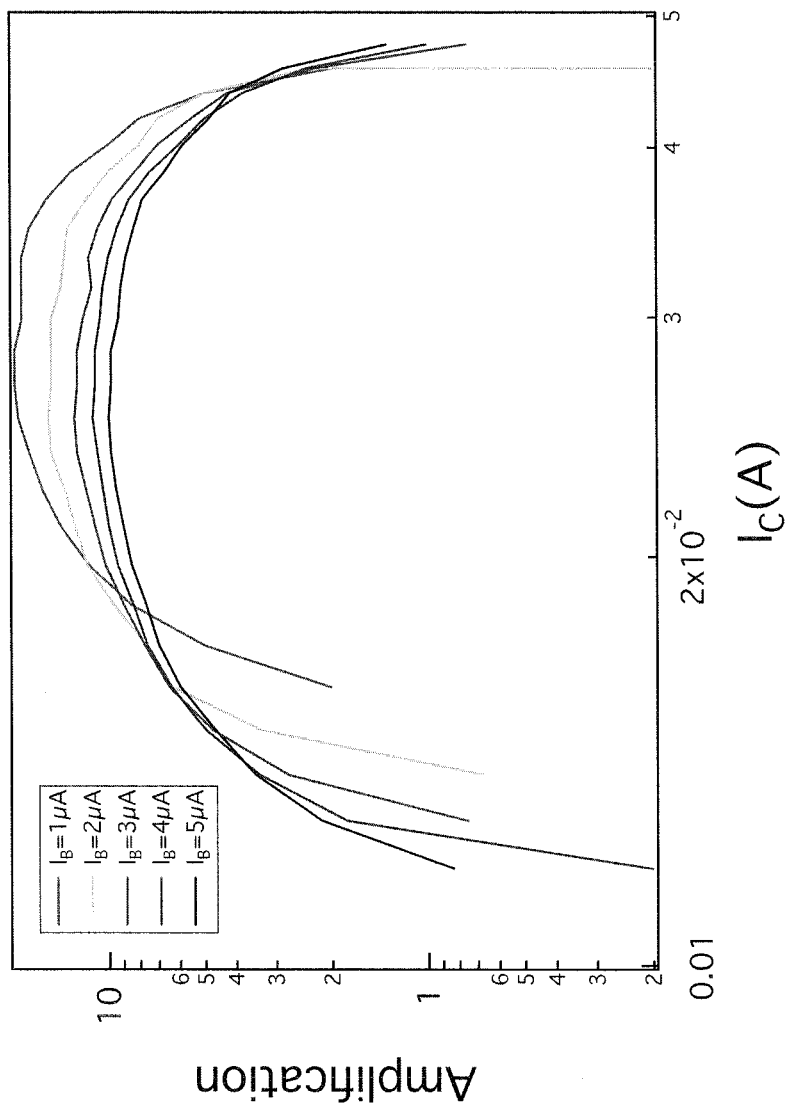
FIG. 5 shows schematically a logarithmic scaled curve diagram of the log amplification vs log collector current as a function base current according to one embodiment of the present invention.

FIG. 5 shows schematically a logarithmic scaled curve diagram of the log amplification vs log collector current as a function base current according to one embodiment of the present invention. In FIG. 5, the amplification is plotted as a function of the collector current $I_C$ on a log-log plot for different base current values. The highest amplification observed for the heterojunction semiconductor device is 20. In the bipolar MJT, for a very low collector current the amplification is very small due to generation-recombination in the emitter-base depletion region. As the collector current $I_C$ increases, the relative contribution of generation-recombination current to the total collector current decreases thereby leading to an increase in the amplification [21]. For a low collector current $I_C$, the amplification is a function of the collector current given by $$\beta_{dc} \propto I_C^{\left(1 - \frac{1}{\eta_{EB}}\right)},$$

where $\eta_{EB}$ is the ideality factor for the emitter-base junction (such as the first junction 122 in FIG. 1A). Thus, on a log-log plot, the relationship between the log of amplification and log of collector current is linear, as is evident in FIG. 6 for a base current $I_B$ of 2 µA.

At intermediate collector currents $I_C$, there is a narrow region where the transistor characteristics approach ideal behavior, and a plateau is reached in the amplification-collector current curve. However, at higher collector currents $I_C$ the amplification drops rapidly. It should be noted that the slope of the amplification curve is large (and negative) in the high collector current region. In this case, an increase in the base or emitter resistance leads to a decrease in the collector current $I_C$ and amplification. A high injection level caused by current crowding also adds to a decreasing amplification at higher voltages. This is a result of deviation of the emitter base junction from ideal diode behavior [19, 20].

A change in the transistor amplification is observed in the presence of an external magnetic field. The change in amplification upon application of an external magnetic field, the magneto-amplification (MA), is calculated as follows:

$$MA = \frac{\beta_{dc}(B) - \beta_{dc}(0)}{\beta_{dc}(0)} \times 100 \quad (3)$$

where the term $\beta_{dc}(B)$ is the amplification at a magnetic field of B and a bias $V_{EC}$, and $\beta_{dc}(0)$ is the zero magnetic field amplification at the same bias. The magneto-amplification is calculated for a constant emitter-collector bias for a given base current. For the case of $\beta_{dc}(B) < \beta_{dc}(0)$ a negative magneto-amplification results.

Figure 6:
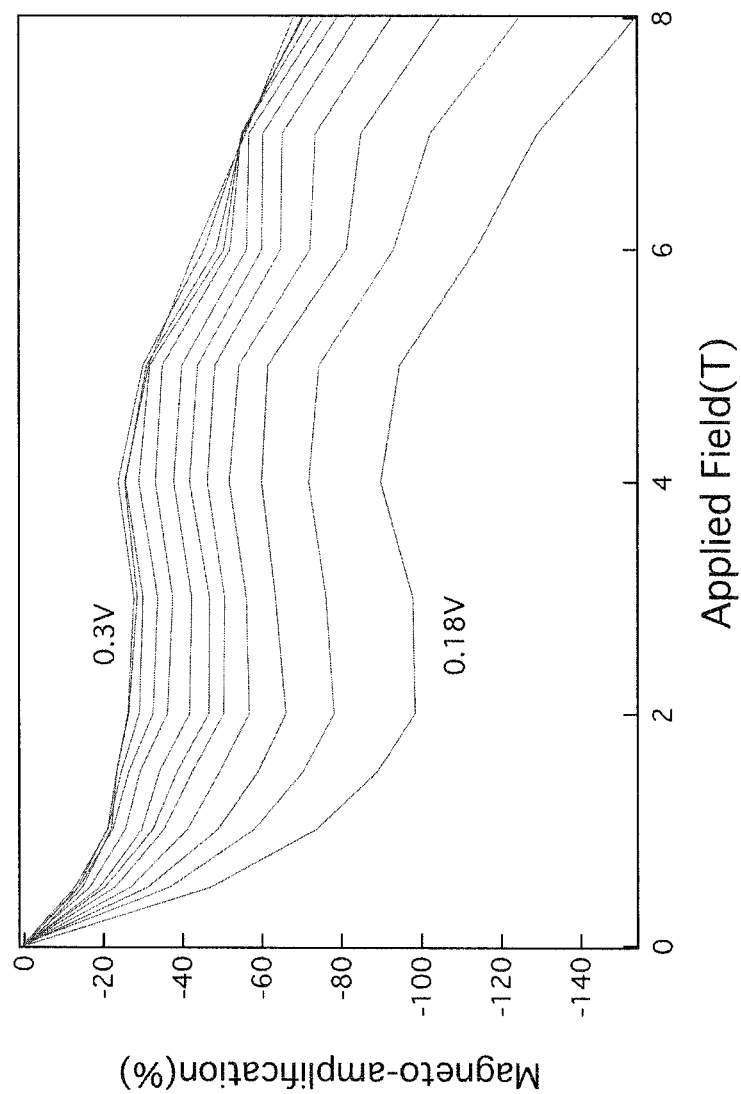
FIG. 6 shows schematically a curve diagram of a magneto-amplification as a function of magnetic field for various emitter collector biases and a base current of 3 μA at 298K according to one embodiment of the present invention.

FIG. 6 shows schematically a curve diagram of a magneto-amplification as a function of magnetic field for various emitter collector biases and a base current of 3 µA at 298K according to one embodiment of the present invention. A negative magneto-amplification is observed for magnetic fields between zero and 8 T and voltages between 0.18V and 0.30V. For magnetic fields of less than 2 T, the absolute magneto-amplification rises rapidly with field whereas for fields higher than 2 T, the decrease in amplification with field is smaller. As the voltage $V_{EC}$ is further increased, the absolute magnitude of magneto-amplification subsequently decreases. For voltages higher than 0.03 V but less than 0.18V, the absolute magneto-amplification is much higher since the device is not in saturation. This bias dependence of magneto-amplification indicates that the region for active operation decreases with increasing magnetic field.

The observed negative magneto-amplification qualitatively agrees with calculations using the modified Ebers-Moll equations as shown in FIG. 3. For a given magnetic field, the calculated magneto-amplification decreases with increasing emitter-collector bias. The non-idealities in the junction that lead to the very high currents are neglected in the model. This results in the quantitative differences between the experimental data and the calculated magneto-amplification.

It is of interest to note that the transistor magneto-amplification curve is similar to the magneto-current dependence of magnetic field for a InMnAs/InAs diode [12]. The sudden increase in magneto-amplification for the transistor at lower magnetic fields and the gradual saturation is similar in functional form to the previously experimentally observed magneto-current ratio for magnetic semiconductor heterojunction diodes [12]. The current through the device at zero and finite base currents determines the amplification of the device and the magnitude of the base current depends on the magnetoresistance of the InMnAs/n-InAs junction. The positive junction magnetoresistance was previously attributed to conduction of spin polarized holes via spin-split valence band [12].

For a zero magnetic field and a finite base current, the transistor is amplifying and it is in a partly "on" state. One could in principle turn the transistor from an amplifying to a non-amplifying (less than 1) state by changing the magnitude of the magnetic field, as can be seen in FIG. 4. In a conventional BJT, the base current traditionally controls the amplification, and at zero base current where the device is not amplifying, it is in the off state. In the exemplary device, an amplification of less than one would be the equivalent of the off state. Application of a magnetic field would result in the magnetic transistor going from an amplifying to a non-amplifying state. This presumably could be achieved while the device is in operation and could potentially lead to reconfigurable logic. This magnetic field control over the amplification could potentially result in applications in new paradigms of computer architecture.

According to the present invention, the semiconductor device is a bipolar MJT using a dilute magnetic semiconductor as the magnetic semiconductor layer. Using InMnAs as the magnetic semiconductor layer of the p-n-p transistor structure, magneto-amplification is observed at the room temperature that depends on the base current and the emitter-collector bias. Thus, when the external magnetic field is applied to the magnetic semiconductor layer in a direction substantially perpendicular to a plane of the second junction, the current amplification is a function of magnitude of an external magnetic field. The observed magneto-amplification is attributed to the magnetoresistance of the magnetic semiconductor InMnAs/InAs heterojunction. The magnetic field dependence of the transistor characteristics confirms that the magneto-amplification results from the magnetoresistance of the collector junction. In other words, The capability of magnetic field control of the amplification in an all-semiconductor transistor at room temperature potentially enables various applications, such as magnetic field detecting apparatuses or the creation of new computer logic architecture where the spin of the carriers is utilized. Examples of these applications are hereinafter described.

Example Three

Due to the magnetic field dependence of the transistor characteristics, the semiconductor device of the present invention can be used for detecting magnetic field. In one embodiment, an apparatus for detecting magnetic field includes a semiconductor device, a means for subjecting the magnetic semiconductor layer to a test area, and a magnetic field detector.

The semiconductor device can be any semiconductor device of the present invention, such as the semiconductor device as shown in FIG. 1A or the bipolar MJT as shown in FIG. 1B, where the current amplification of the semiconductor device is a function of magnitude of an external magnetic field when the external magnetic field is applied to the magnetic semiconductor layer of the semiconductor device in a direction substantially perpendicular to a plane of the second junction.

The magnetic field detector is coupled to the semiconductor device for determining the presence of the external magnetic field in the test area. Specifically, the magnetic field detector measures the current amplification, and if change to the current amplification due to the external magnetic field is measured, the external magnetic field is present in the test area. In other words, if the current amplification does not change, there is no external magnetic field in the test area, and if change of the current amplification is detected, an external magnetic field is present in the test area.

The subjecting means can be, but is not limited to, any device or apparatus that is coupled to the magnetic semiconductor layer to transfer, move and/or rotate the magnetic semiconductor layer to the test area. Examples of the subjecting means can be a read head, platform, a rotator, a shaft, a disc, a robot arm, planar or three-dimensional bar linkages, or other moving or rotating mechanisms, or any combinations thereof.

Figure 7:
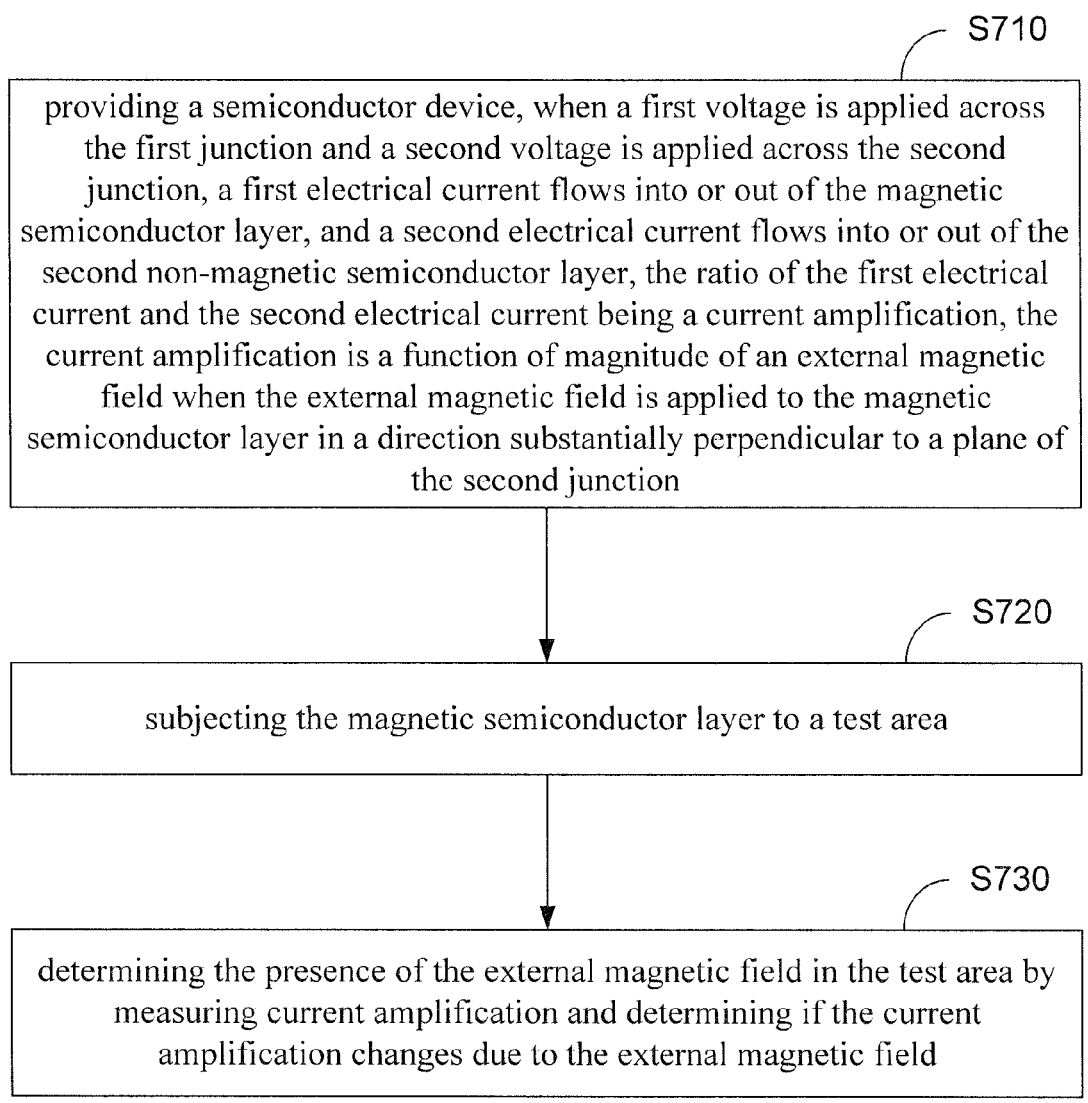
FIG. 7 shows a flowchart of a method of detecting magnetic field according to one embodiment of the present invention.

In one aspect, a method of detecting magnetic field is provided using the semiconductor device of the present invention. FIG. 7 shows a flowchart of a method of detecting magnetic field according to one embodiment of the present invention.

In step S710, a semiconductor device, such as the semiconductor device as shown in FIG. 1A or the bipolar MJT as shown in FIG. 1B, is provided, where the current amplification of the semiconductor device is a function of magnitude of an external magnetic field when the external magnetic field is applied to the magnetic semiconductor layer of the semiconductor device in a direction substantially perpendicular to a plane of the second junction.

In step S720, the magnetic semiconductor layer of the semiconductor device is subjected to the test area. The magnetic semiconductor layer can be subjected by transferring, moving and/or rotating of the magnetic semiconductor layer, or any other applicable method, to the test area, and the means or devices for subjecting the magnetic semiconductor layer can be a platform, a rotator, a shaft, a disc, a robot arm, planar or three-dimensional bar linkages, or other moving or rotating mechanisms, or any combinations thereof.

In step S730, the presence of the external magnetic field in the test area can be determined by measuring the current amplification of the semiconductor device and determining if the current amplification changes due to the external magnetic field. In other words, if the current amplification does not change, there is no external magnetic field in the test area, and if change of the current amplification is detected, an external magnetic field is present in the test area.

Example Four

Due to the magnetic field dependence of the transistor characteristics, the semiconductor device of the present invention can be used for reprogramming a logic process. In one embodiment, a reprogrammable logic apparatus includes a semiconductor device, a means for subjecting the magnetic semiconductor layer to a magnetic field, and a storage member.

The semiconductor device can be any semiconductor device of the present invention, such as the semiconductor device as shown in FIG. 1A or the bipolar MJT as shown in FIG. 1B, where the presence of an external magnetic field causes the current amplification to change, and the magnetic semiconductor material is in a first non-volatile state when there is a change in the current amplification, and the magnetic semiconductor material is in a second non-volatile state when there is not a change in the current amplification. Thus, each of the first and second non-volatile states may represent a binary value 0 or 1.

The subjecting means can be, but is not limited to, any device or apparatus that is coupled to the magnetic semiconductor layer to transfer, move and/or rotate the magnetic semiconductor layer to a magnetic field in order to set the magnetic semiconductor material to one of the first and second non-volatile states, thereby generating a corresponding new binary value relating to a new input logic signal. Examples of the subjecting means can be a read head, platform, a rotator, a shaft, a disc, a robot arm, planar or three-dimensional bar linkages, or other moving or rotating mechanisms, or any combinations thereof. Alternatively, the subjecting means can be a magnetic field controller or generator to generate a variable magnetic field for the semiconductor device.

The storage is provided for storing the new binary value relating to the new input logic signal so as to reprogram a logic process. Specifically, the magnetic field detector measures the current amplification, and if change to the current amplification due to the external magnetic field is measured, the external magnetic field is present in the test area. In other words, if the current amplification does not change, there is no external magnetic field in the test area, and if change of the current amplification is detected, an external magnetic field is present in the test area.

Figure 8:
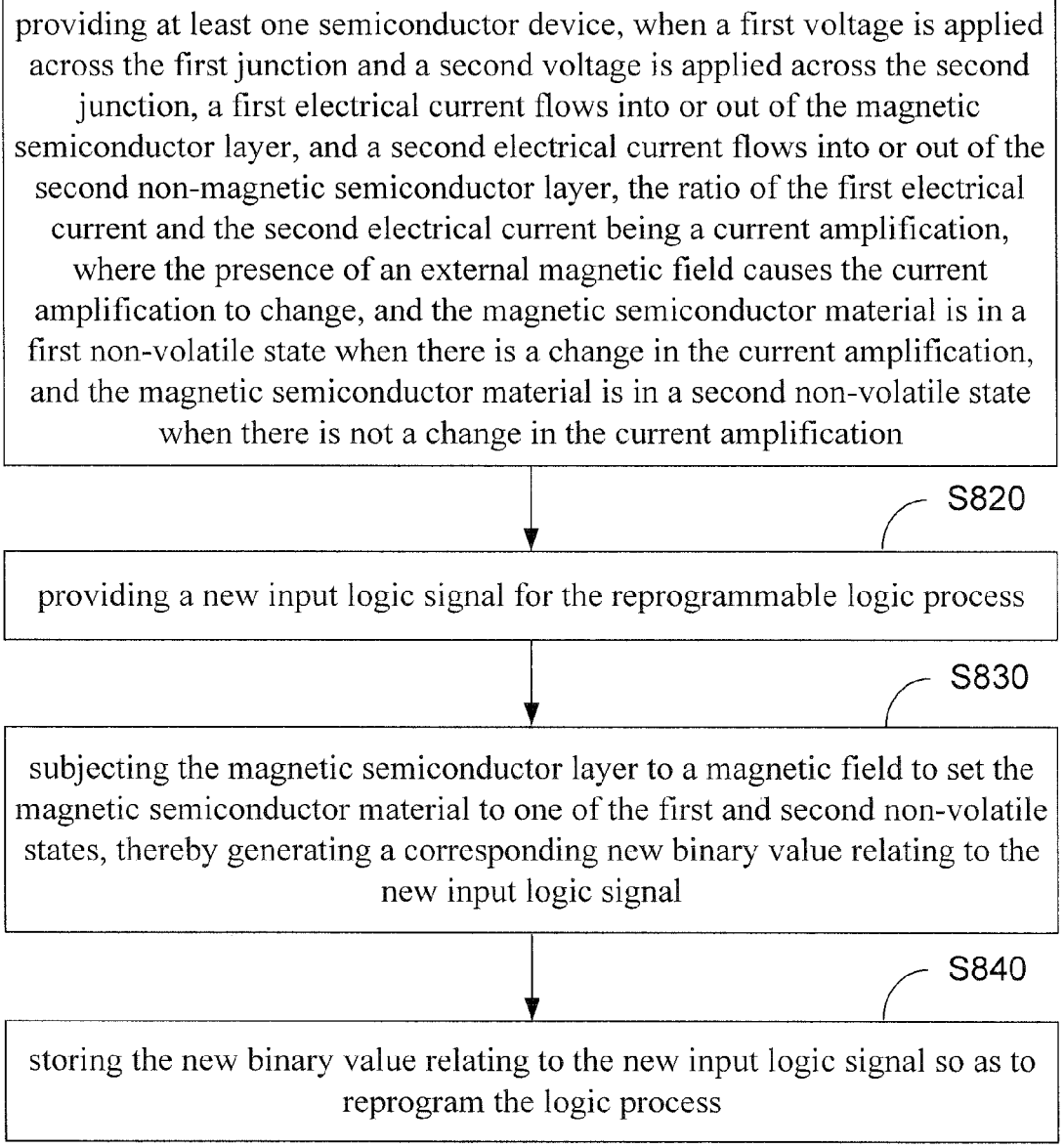
FIG. 8 shows a flowchart of a method of detecting magnetic field according to one embodiment of the present invention.

In one aspect, a method of operating a reprogrammable logic process using the semiconductor device of the present invention. FIG. 8 shows a flowchart of a method of operating a reprogrammable logic process according to one embodiment of the present invention.

In step S810, a semiconductor device, such as the semiconductor device as shown in FIG. 1A or the bipolar MJT as shown in FIG. 1B, is provided, where the presence of an external magnetic field causes the current amplification to change. The magnetic semiconductor material is in a first non-volatile state when there is a change in the current amplification, and the magnetic semiconductor material is in a second non-volatile state when there is not a change in the current amplification. Thus, each of the first and second non-volatile states may represent a binary value 0 or 1.

In step S820, a new input logic signal for the reprogrammable logic process is provided.

In step S830, the magnetic semiconductor layer of the semiconductor device is subjected to a magnetic field to set the magnetic semiconductor material to one of the first and second non-volatile states, thereby generating a corresponding new binary value relating to the new input logic signal. The magnetic semiconductor layer can be subjected by transferring, moving and/or rotating of the magnetic semiconductor layer, or any other applicable method, to the test area, and the means or devices for subjecting the magnetic semiconductor layer can be a platform, a rotator, a shaft, a disc, a robot arm, planar or three-dimensional bar linkages, or other moving or rotating mechanisms, or any combinations thereof. Alternatively, the magnetic semiconductor layer can be subjected by controlling or generating a variable magnetic field for the semiconductor device.

In step S840, the new binary value relating to the new input logic signal is stored so as to reprogram the logic process.

In summary, the present invention, among other things, recites a bipolar MJT using a dilute magnetic semiconductor and applications of the same. In the exemplary embodiment of an InMnAs p-n-p transistor, magneto-amplification is observed at the room temperature. The observed magneto-amplification is attributed to the magnetoresistance of the magnetic semiconductor InMnAs heterojunction. The magnetic field dependence of the transistor characteristics confirms that the magneto-amplification results from the junction magnetoresistance. To describe the experimentally observed transistor characteristics, a modified Ebers-Moll model that includes a series magnetoresistance attributed to spin-selective conduction is provided. The capability of magnetic field control of the amplification in an all-semiconductor transistor at room temperature potentially enables the creation of new computer logic architecture where the spin of the carriers is utilized.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

List of References

[1] I. Zutic, J. Fabian, and S. Das Sarma, Rev. Mod. Phys. 76, 323 (2004).
[2] D. D. Awschalom, and M. E. Flatte, Nat. Phys. 3, 153 (2007).
[3] C. Chappert, A. Fert, and F. N. Van Dau, Nature Materials 6, 813 (2007).
[4] Appelbaum, B. Q. Huang, and D. J. Monsma, Nature 447, 295 (2007).
[5] B. Q. Huang, D. J. Monsma, and I. Appelbaum, Appl. Phys. Lett. 91, 3 (2007).
[6] T. Dietl, H. Ohno, and F. Matsukura, IEEE Trans. Electron Devices 54, 945 (2007).
[7] N. Lebedeva, and P. Kuivalainen, J. Appl. Phys. 93, 9845 (2003).
[8] J. Fabian, I. Zutic, and S. Das Sarma, Phys. Rev. B 66, 24 (2002).
[9] R. R. Pela, and L. K. Teles, J. Magn. Magn. Mater. 321, 984 (2009).
[10] Zutic, J. Fabian, and S. C. Erwin, IBM J. Res. Dev. 50, 121 (2006).
[11] S. J. May, and B. W. Wessels, Appl. Phys. Lett. 88, 3 (2006).
[12] N. Rangaraju, P. C. Li, and B. W. Wessels, Phys. Rev. B 79, 5 (2009).
[13] B. W. Wessels, New J. Phys. 10 (2008).
[14] P. T. Chiu, and B. W. Wessels, Phys. Rev. B 76, 6 (2007).
[15] J. Fabian, I. Zutic, and S. Das Sarma, Appl. Phys. Lett. 84, 85 (2004).
[16] J. Fabian, and I. Zutic, Appl. Phys. Lett. 86, 3 (2005).
[17] The coupled nature of the Ebers-Moll equations lead to changes in both the forward and reverse bias currents for a given base current. Also, our calculations and experiments show that the collector current for zero and finite base current changes leading to the observed behavior.
[18] The inventors observed a positive magnetoresistance in their collector-base junction and this positive magnetoresistance indicates that there is an increase in the transistor resistance as the magnetic field is increased. The increased resistance of the device leads to a negative magneto-amplification.
[19] S. M. Sze, and K. K. Ng, Physics of Semiconductor Devices (Wiley-Interscience, 2007).
[20] G. W. Neudeck, *The Bipolar Junction Transistor* (Addison-Wesley Publishing Company, Inc., 1989), Vol. III.

What is claimed is:

1. A semiconductor device, comprising:
    (a) a first non-magnetic semiconductor layer with majority charge carriers of a first polarity;
    (b) a second non-magnetic semiconductor layer disposed adjacent to the first non-magnetic semiconductor layer such that a first junction is formed at a first interface region between the first non-magnetic semiconductor layer and the second non-magnetic semiconductor layer;
    (c) a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer;
    (d) a first electrode that is in an ohmic contact with the first non-magnetic semiconductor layer;
    (e) a second electrode that is in an ohmic contact with the second non-magnetic semiconductor layer; and
    (f) a third electrode that is in an ohmic contact with the magnetic semiconductor layer.

2. The semiconductor device of claim 1, wherein the semiconductor device is a bipolar magnetic junction transistor (MJT).

3. The semiconductor device of claim 1, wherein the first non-magnetic semiconductor layer comprises InAs.

4. The semiconductor device of claim 3, wherein the InAs is p-type doped.

5. The semiconductor device of claim 1, wherein the magnetic semiconductor layer comprises p-type doped InMnAs.

6. The semiconductor device of claim 1, wherein the second non-magnetic semiconductor layer is charge carrier neutral.

7. The semiconductor device of claim 6, wherein the second non-magnetic semiconductor layer comprises undoped InAs.

8. The semiconductor device of claim 1, wherein the second non-magnetic semiconductor layer has majority charge carriers of a second polarity that is opposite of the first polarity.

9. The semiconductor device of claim 8, wherein the second non-magnetic semiconductor layer comprises n-type doped InAs.

10. The semiconductor device of claim 1, wherein the magnetic semiconductor layer has a Curie temperature that is greater than about 298 K.

11. The semiconductor device of claim 1, wherein, when a first voltage is applied between the first electrode and the second electrode and a second voltage is applied between the second electrode and the third electrode, a first electrical current flows into or out of the magnetic semiconductor layer, and a second electrical current flows into or out of the second non-magnetic semiconductor layer, the ratio of the first electrical current and the second electrical current being a current amplification.

12. The semiconductor device of claim 11, wherein, when a magnetic field is applied to the magnetic semiconductor layer in a direction substantially perpendicular to a plane of the second junction, the current amplification is a function of the magnitude of the magnetic field.

13. An apparatus for detecting magnetic field, comprising:
    (a) a semiconductor device, comprising:
        a first non-magnetic semiconductor layer with majority charge carriers of a first polarity;
        a second non-magnetic semiconductor layer disposed adjacent to the first non-magnetic semiconductor layer such that a first junction is formed at a first interface region between the first non-magnetic semiconductor layer and the second non-magnetic semiconductor layer; and
        a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer,
        wherein when a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification, the current amplification is a function of magnitude of an external magnetic field when the external magnetic field is applied to the magnetic semiconductor layer in a direction substantially perpendicular to a plane of the second junction;

(b) means for subjecting the magnetic semiconductor layer to a test area; and (c) a magnetic field detector coupled to the semiconductor device for determining the presence of the external magnetic field in the test area by measuring current amplification and determining if the current amplification changes due to the external magnetic field.

14. The apparatus of claim 13, wherein the semiconductor device is a bipolar magnetic junction transistor (MJT).

15. The apparatus of claim 13, wherein the first non-magnetic semiconductor layer comprises InAs.

16. The apparatus of claim 15, wherein the InAs is p-type doped.

17. The apparatus of claim 13, wherein the second non-magnetic semiconductor layer comprises undoped or n-type doped InAs.

18. The apparatus of claim 13, wherein the magnetic semiconductor layer comprises p-type doped InMnAs.

19. The apparatus of claim 13, wherein the subjecting means comprises a read head.

20. A method of detecting magnetic field, comprising:
(a) providing a semiconductor device, the semiconductor device comprising:
a first non-magnetic semiconductor layer with majority charge carriers of a first polarity;
a second non-magnetic semiconductor layer disposed adjacent to the first non-magnetic semiconductor layer such that a first junction is formed at a first interface region between the first non-magnetic semiconductor layer and the second non-magnetic semiconductor layer; and
a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer,
wherein when a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification, the current amplification is a function of magnitude of an external magnetic field when the external magnetic field is applied to the magnetic semiconductor layer in a direction substantially perpendicular to a plane of the second junction;

(b) subjecting the magnetic semiconductor layer to a test area; and (c) determining the presence of the external magnetic field in the test area by measuring current amplification and determining if the current amplification changes due to the external magnetic field.

21. The method of claim 20, wherein the semiconductor device is a bipolar magnetic junction transistor (MJT).

22. The method of claim 20, wherein the first non-magnetic semiconductor layer comprises InAs.

23. The method of claim 22, wherein the InAs is p-type doped.

24. The method of claim 20, wherein the second non-magnetic semiconductor layer comprises undoped or n-type doped InAs.

25. The method of claim 20, wherein the magnetic semiconductor layer comprises p-type doped InMnAs.

26. A reprogrammable logic apparatus, comprising:
(a) at least one semiconductor device, wherein the at least one semiconductor device comprises:
a first non-magnetic semiconductor layer with majority charge carriers of a first polarity;
a second non-magnetic semiconductor layer disposed adjacent to the first non-magnetic semiconductor layer such that a first junction is formed at a first interface region between the first non-magnetic semiconductor layer and the second non-magnetic semiconductor layer; and
a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer,
wherein when a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification,
wherein the presence of an external magnetic field causes the current amplification to change,
wherein the magnetic semiconductor layer is in a first non-volatile state when there is a change in the current amplification, and the magnetic semiconductor layer is in a second non-volatile state when there is not a change in the current amplification, and
wherein each of the first and second non-volatile states represents a binary value;

(b) means for subjecting the magnetic semiconductor layer to a magnetic field to set the magnetic semiconductor layer to one of the first and second non-volatile states, thereby generating a corresponding new binary value relating to a new input logic signal; and (c) a storage member for storing the new binary value relating to the new input logic signal so as to reprogram a logic process.

27. The apparatus of claim 26, wherein the semiconductor device is a bipolar magnetic junction transistor (MJT).

28. The apparatus of claim 26, wherein the first non-magnetic semiconductor layer comprises InAs.

29. The apparatus of claim 28, wherein the InAs is p-type doped.

30. The apparatus of claim 26, wherein the second non-magnetic semiconductor layer comprises undoped or n-type doped InAs.

31. The apparatus of claim 26, wherein the magnetic semiconductor layer comprises p-type doped InMnAs.

32. The apparatus of claim 26, wherein the subjecting means comprises a read head.

33. A method of operating a reprogrammable logic process, comprising:

(a) providing at least one semiconductor device, wherein the at least one semiconductor device comprises:
a first non-magnetic semiconductor layer with majority charge carriers of a first polarity;
a second non-magnetic semiconductor layer disposed adjacent to the first non-magnetic semiconductor layer such that a first junction is formed at a first interface region between the first non-magnetic semiconductor layer and the second non-magnetic semiconductor layer; and
a magnetic semiconductor layer with majority charge carriers of the first polarity disposed adjacent to the second non-magnetic semiconductor layer such that a second junction is formed at a second interface region between the second non-magnetic semiconductor layer and the magnetic semiconductor layer,
wherein when a first voltage is applied across the first junction and a second voltage is applied across the second junction, a first electrical current flows into or out of the magnetic semiconductor layer, and a second electrical current flows into or out of the second non-magnetic semiconductor layer, the ratio of the first electrical current and the second electrical current being a current amplification,
wherein the presence of an external magnetic field causes the current amplification to change,
wherein the magnetic semiconductor layer is in a first non-volatile state when there is a change in the current amplification, and the magnetic semiconductor layer is in a second non-volatile state when there is not a change in the current amplification, and
wherein each of the first and second non-volatile states represents a binary value;
(b) providing a new input logic signal for the reprogrammable logic process;
(c) subjecting the magnetic semiconductor layer to a magnetic field to set the magnetic semiconductor layer to one of the first and second non-volatile states, thereby generating a corresponding new binary value relating to the new input logic signal; and
(d) storing the new binary value relating to the new input logic signal so as to reprogram the logic process.

34. The method of claim 33, wherein the semiconductor device is a bipolar magnetic junction transistor (MJT).

35. The method of claim 33, wherein the first non-magnetic semiconductor layer comprises InAs.

36. The method of claim 35, wherein the InAs is p-type doped.

37. The method of claim 33, wherein the second non-magnetic semiconductor layer comprises undoped or n-type doped InAs.

38. The method of claim 33, wherein the magnetic semiconductor layer comprises p-type doped InMnAs.

* * * * *